United States Patent
Lee

(10) Patent No.: US 6,388,245 B1
(45) Date of Patent: May 14, 2002

(54) BUILT-IN SELF TEST SIGNALS FOR COLUMN OUTPUT CIRCUITS IN X-Y ADDRESSABLE IMAGE SENSOR

(75) Inventor: Paul P. Lee, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/560,227

(22) Filed: Apr. 28, 2000

(51) Int. Cl.$^7$ ............................................. H01L 27/00
(52) U.S. Cl. .................................. 250/208.1; 250/214 R
(58) Field of Search ........................ 250/208.1, 214 R; 356/222; 348/294, 302, 304, 309, 311; 257/291, 440

(56) References Cited

U.S. PATENT DOCUMENTS

| | | | |
|---|---|---|---|
| 4,612,578 A | * 9/1986 | Breithaupt | ................... 358/212 |
| 4,862,276 A | 8/1989 | Wang et al. | ............ 358/213.31 |
| 5,900,623 A | 5/1999 | Tsang et al. | ............. 250/208.1 |

* cited by examiner

Primary Examiner—Que T. Le
(74) Attorney, Agent, or Firm—Peyton C. Watkins

(57) ABSTRACT

This present invention illustrates that alternating bright and dark pixels wherein the periods of bright and dark are varied by changing the consecutive number of pixels that are bright and dark. Accordingly, the present invention provides a technique and architectural design to achieve efficient testing of the multiple parallel output column circuits integrated with an X-Y addressable image sensor by using on-chip signals. This invention is particularly useful in testing high-speed output column CDS circuits for a high frame rate image sensor fabricated using a Complementary Metal Oxide Semiconductor (CMOS) active pixel sensor (APS) technology incorporating a pinned photo-diode. The technique allow testing of the frequency response of the output column circuits by observing of the output signals either in analog form or digital bits if an on-chip ADC is used without applying any external input signals.

18 Claims, 2 Drawing Sheets

US 6,388,245 B1

BUILT-IN SELF TEST SIGNALS FOR COLUMN OUTPUT CIRCUITS IN X-Y ADDRESSABLE IMAGE SENSOR

FIELD OF THE INVENTION

The present invention is related to semiconductor based image sensing devices and, more particularly, to a method and apparatus for use with column output circuits for an X-Y addressable pixel array.

BACKGROUND OF THE INVENTION

There are numerous prior art teachings relating to X-Y addressable imagers, which are semiconductor based imagers that can be either passive pixel sensor (PPS) devices or active pixel sensor (APS) devices. The difference being that PPS devices do not provide active circuit elements (such as amplifiers) allocated on a pixel-by-pixel basis. Instead PPS devices generally output directly from the pixel onto a column bus. The APS devices, on the other hand, typically provide amplifiers on a pixel-by-pixel basis. CMOS active pixel image sensors have been recently commercialized to supplement and replace charge-coupled devices (CCD) in many applications. CMOS image sensors have advantages in low-power operation and being able to be integrated with on-chip signal processing and control functions making them suitable for systems requiring low-cost portable imaging devices.

Very often, multiple column circuits are used to process pixel signals in parallel to achieve the low power operation. In PPS devices, column circuits receive pixel data directly and hold it in a multiplexed manner until analog-to-digital conversion (ADC) can be performed. In APS devices not only will the column circuits perform the function of a simple multiplexor, but correlated double sampling (CDS) is additionally accomplished prior to analog to digital conversion. Typically, the column output circuits that are provided within the same chip as the PPS and APS image sensor devices to perform these functions, have been limited to rows designed for the injection of charges of a predetermined voltage level. These analog-injection or charges are used to identify the characteristics of the column output circuits. There is a shortcoming in these on chip injection circuits as employed by prior art PPS and APS devices in that they do not provide for an analysis of the spatially varying frequency response or the time frequency response characteristics of the column output circuits.

Form the foregoing discussion, it should be readily apparent that there remains a need within the art for a method and apparatus that provides for an analysis of the characteristics of the column output circuits as a response to a spatially varying frequency stimuli. At a fixed timing clock frequency, the response to spatial variations is then directed translatable into time frequency response.

SUMMARY OF THE INVENTION

This present invention addresses the aforementioned needs within the art by disclosing a method and apparatus that provides for an analysis of the characteristics of the column output circuits as a response to a spatially varying frequency stimuli. The preferred embodiment illustrates that alternating bright and dark pixels wherein the periods of bright and dark are varied by changing the consecutive number of pixels that are bright and dark. Accordingly, the present invention provides a technique and architectural design to achieve efficient testing of the multiple parallel output column circuits integrated with an X-Y addressable image sensor by using on-chip analog injection signals. This invention is particularly useful in testing high-speed output column CDS circuits for a high frame rate image sensor fabricated using a Complementary Metal Oxide Semiconductor (CMOS) active pixel sensor (APS) technology incorporating a pinned photo-diode. The technique of the present invention allows for testing the frequency responses of the output column circuits by observing of the output signals either in analog form, or digital bits if an on-chip ADC is used, by measuring only the output response to the injection signals without requiring the application of any external time varying input signals. By employing a fixed timing clock frequency, the response to spatial variations is then directed translatable into time frequency response.

These features are provided within the present invention by an X-Y addressable image sensor with built-in, self-testing provisions of column output circuits comprising: a plurality of pixels arranged in a plurality of rows and a plurality of columns to form the X-Y addressable image sensor; a plurality of column output circuits; at least one row used as an injection row, the injection row being electrically coupled to a predetermined signal level; selection means for enabling the pixels in the injection row to output to the column output circuits; and means for altering the predetermined signal level applied to the pixels of the injection row.

BRIEF DESCRIPTION OF THE DRAWINGS

FIG. 1b is a diagram of the analog signal that is input into the injection row within the prior art device of FIG. 1a;

FIG. 1c is a diagram of the signal that is output from the column output circuits of the prior art device of FIG. 1a;

FIG. 2b is a diagram of the analog signal that is input into the injection row within the present invention of FIG. 2a;

FIG. 2c is a diagram of the signal that is output from the column output circuits of the present invention as shown in FIG. 2a; and FIG. 2d is a diagram of the signal that is output from the column output circuits of the present invention as shown in FIG. 2a.

DETAILED DESCRIPTION OF THE INVENTION

Figure 1A:
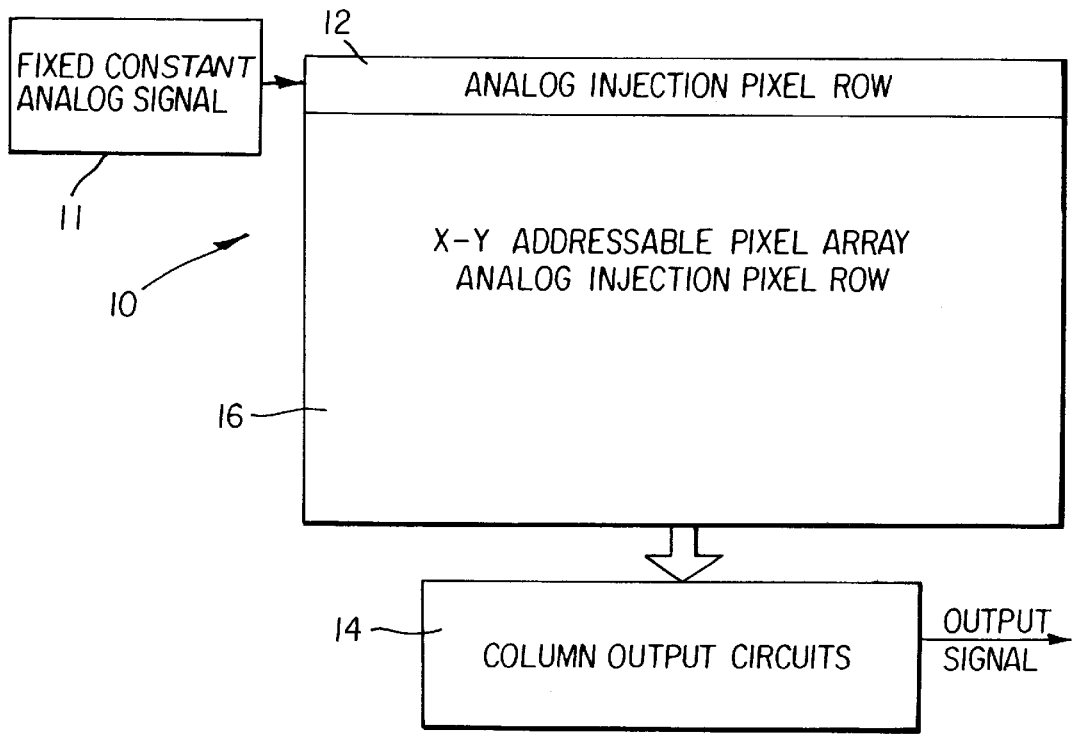
FIG. 1a is a block diagram of a prior art device that provides a fixed analog signal into an injection row.

Referring to FIGS. 2a, 2b, 2c and 2d, a method and apparatus is illustrated that can accomplish characterization of the frequency response of the column output circuits 24 within image sensing device 20 without the use of an external function generator. This is accomplished, within the preferred embodiment, by selectively connecting groups of dark pixels 23 in an analog injection row 22 to the image sensor ground or reset level, while allowing complementary groups of bright pixels 25 to receive the fixed analog signal 21 without being turned into dark pixels 23 by grounding or being placed at some reset level. Within the preferred embodiment, the groups of dark pixels 23 are placed at some predetermined level (either grounded or some reset potential) and arranged in a sequence of increasing numbers. Thus, the analog injection row 22 will output signals as a sequence of square waves with increasing or decreasing frequencies (akin to a "chirp signal"). The amplitudes of this sequence are between a high signal, which can be an externally supplied injection signal, or from an on-chip reference voltage generator to represent the high (or bright) level and the ground or reset levels. The reset levels are obtained by connecting the reset transistor gates of each pixel to the high side of the power supply or VDD.

Accordingly, the present invention provides a technique and architectural design to achieve efficient testing of the multiple parallel output column circuits integrated with an X-Y addressable image sensor by using on-chip signals. This invention is particularly useful in testing high-speed output column CDS circuits for a high frame rate image sensor fabricated using a Complementary Metal Oxide Semiconductor (CMOS) active pixel sensor (APS) technology incorporating a pinned photo-diode. The technique allows testing of the frequency response of the output column circuits by observing of the output signals either in analog form or digital bits if an on-chip ADC is used without applying any external input signals. The techniques of the present invention are also applicable to PPS devices for testing the column output circuits 24 within those types of devices (including but not limited to CDS circuitry, multiplexers, and amplifiers) within the column output circuits 24 which can also benefit from the spatially varying teachings of the present invention. Spatially varying techniques can test the ability of the circuits to change states as a result of time varying inputs.

Figure 2A:
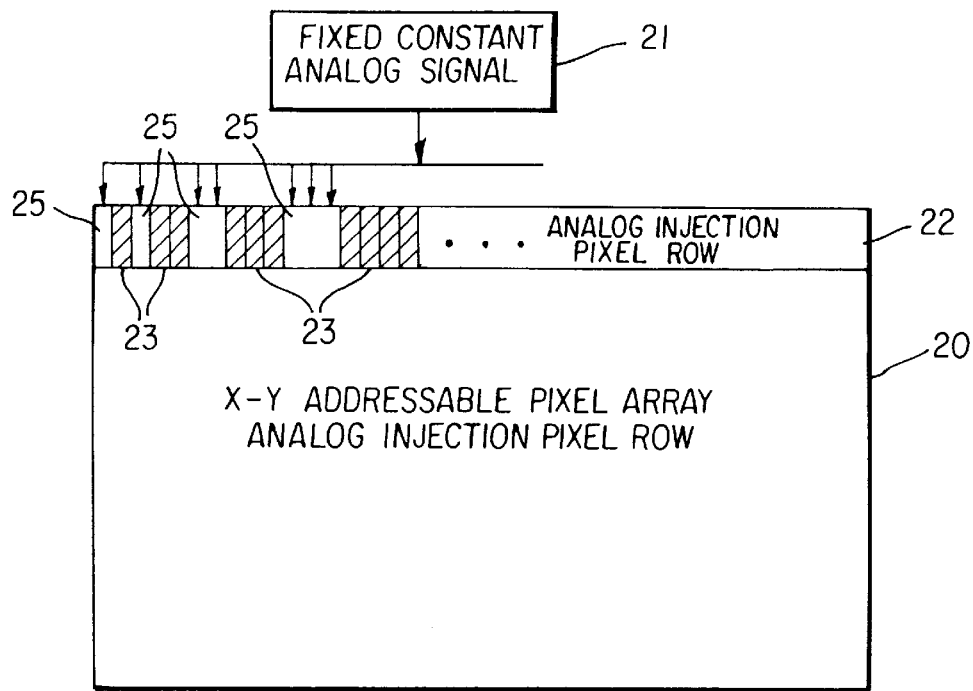
FIG. 2a is a similar block diagram illustrating the spatially varying signal that is applied to the injection row within the preferred embodiment of the present invention.
Figure 2B:
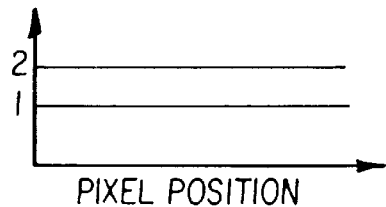
Figure 2C:
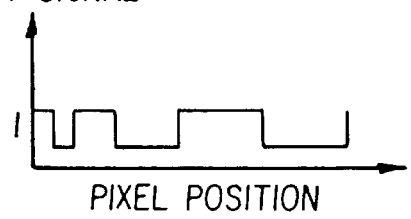
Figure 2D:
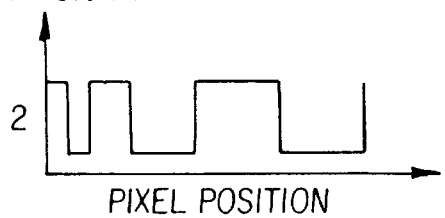

Referring to FIG. 2a, the present invention provides a method and apparatus for an analysis of the characteristics of the column output circuits 24 as a response to a spatially varying frequency stimuli. The preferred embodiment, as seen in FIG. 2a, illustrates that a spatially varying frequency stimuli can be arranged on the same chip as the image sensing device 20 by creating a series of bright pixels 25 that alternate with a series of dark pixels 23. As seen in FIG. 2a, the alternating periods of the bright pixels 25 and dark pixels 23 are varied by changing the consecutive number of pixels that are either bright or dark, resulting in a frequency that is based on varying the spatial span.

In X-Y addressable image sensors, multiple column circuits are used to achieve low power and/or high-speed output. These column circuits are typically applied in a parallel fashion to process the picture elements (pixels) within a selected output row. There is typically a separate column output circuit for each column, at least a multiplexing circuit that will hold the pixel value for each column, however it will be understood by those skilled within the art that additional column processing circuits can be combined. Therefore, adjacent pixels are typically routed through different independent output circuits which, due to process technology variations and/or layout differences, are slightly different from each other. It is desirable to characterize these variations which add a fixed pattern noise (FPN) in the captured image. However, this FPN can be removed by the use of CDS circuit that can be part of the column or externally with analog or digital processing circuits.

Figure 1B:
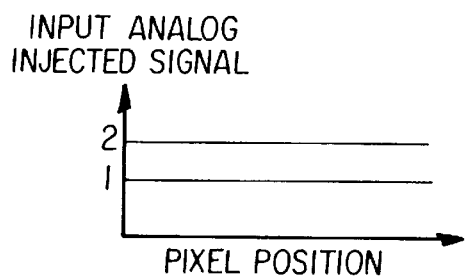
Figure 1C:
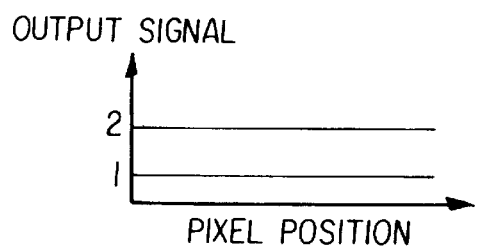

The prior art image sensor 10 illustrated in FIGS. 1a, 1b and 1c has the approach that is conventionally applied to provide an on chip test circuit. This approach is to modify an entire row of pixels by the electrical injection of a known analog signal that is used in replace of the optical responses from pixels that would typically be applied to the column output circuits in normal use. This is illustrated in FIG. 1b wherein various analog signal levels can be injected into the analog injection pixel row 12 to be used within the column output circuits 14 in place of the pixels within pixel array 16. Therefore, the input to the column output circuits 14 is constant and the average transfer characteristics of the column output circuits 14 can be measured once the column fixed pattern noise (FPN) is removed. However, this method does not allow characterization of transient, time-varying responses with a test circuit that is supplied on-chip. In order to receive a time-varying signal, an external function generator with variable frequency output is required to replace the constant analog signal 11 that can be injected via on-chip test circuitry.

The present invention as illustrated in FIGS. 2a–2d, and described above, provides the time-varying signal on-chip without the need for external function generators. The method of the present invention allows the characterization of transient, time varying responses with an on-chip test circuit. This supply of a time-varying signal is done without the necessity of external circuitry. The variable frequency output of the analog injection pixel row 22 of the present invention is injected via on-chip test circuitry to replace the constant analog signal 11 that is conventionally used by prior art devices.

The invention has been described in detail with particular reference to certain preferred embodiments thereof, but it will be understood that variations and modifications can be effected within the spirit and scope of the invention.

PARTS LIST 10 image sensor
11 constant analog signal
12 analog injection pixel row
14 column output circuits
16 pixel array
20 image sensing device
21 fixed analog signal
22 analog injection pixel row
23 dark pixels
24 column output circuits
25 bright pixels

What is claimed is:

1. An X-Y addressable image sensor with built-in self-testing provisions of column output circuits comprising:
   a plurality of pixels arranged in a plurality of rows and a plurality of columns to form the X-Y addressable image sensor;
   a plurality of column output circuits;
   at least one row used as an injection row, the injection row being electrically coupled to a predetermined signal level;
   selection means for enabling the pixels in the injection row to output to the column output circuits; and
   means for altering the predetermined signal level applied to the pixels of the injection row.

2. The X-Y addressable image sensor of claim 1 wherein the X-Y addressable image sensor is a passive pixel sensor.

3. The X-Y addressable image sensor of claim 1 wherein the X-Y addressable image sensor is an active pixel sensor.

4. The active pixel image sensor of claim 3 wherein the means for altering further comprise sequences of bright and dark levels to provide a variable frequency waveform to the column output circuits.

5. The X-Y addressable image sensor of claim 1 further comprising means for capture and evaluation of the injection row data from the column output circuits for characterizing the frequency response of the column output circuits.

6. The X-Y addressable image sensor of claim 1 wherein the means for altering further comprises means for changing interconnecting layers by one of the following: (contacts, metals and vias).

7. The X-Y addressable image sensor of claim 1 wherein the means for altering further comprises a plurality of the pixels within the injection row having a reset signal being applied to the plurality of pixels.

8. The X-Y addressable image sensor of claim 1 wherein the injection row provides built-in self-testing provisions of column output circuits.

9. The X-Y addressable image sensor of claim 1 wherein the injection row further comprises a row of analog injection pixels which have built-in sequences of "bright" and "dark" levels to provide a variable frequency output wave form.

10. A method of forming an X-Y addressable image sensor to achieve built-in self-testing of column output circuits comprising:

providing the X-Y addressable image sensor with a plurality of pixels arranged in rows and columns with a plurality of column output circuits and at least one row used as an injection row, the injection row being coupled to means for altering charge within the pixels in the injection row;

forming selection means for enabling the pixels in the injection row to output to the column output circuits; and altering charge in the pixels of the injection row to form a predetermined sequence to be applied to the column output circuits.

11. The method of claim 10 wherein the step of providing further comprises providing a passive pixel sensor as the X-Y addressable image sensor.

12. The method of claim 10 wherein the step of providing further comprises providing an active pixel sensor as the X-Y addressable image sensor.

13. The method of claim 12 wherein the step of altering further comprise altering sequences of bright and dark levels to provide a variable frequency waveform to the column output circuits.

14. The method of claim 10 wherein the step of providing further comprises providing means for capture and evaluation of the injection row data from the column output circuits for characterizing the frequency response of the column output circuits.

15. The method of claim 10 wherein the step altering further e comprises means for changing interconnecting layers by one of the following: (contacts, metals and vias).

16. The method of claim 10 wherein the step of altering further comprises resetting a plurality of the pixels within the injection row.

17. The method of claim 10 further comprising the step of employing the altered injection for row built-in self-testing of the column output circuits.

18. The method of claim 10 wherein the step of altering further comprises altering the injection row to provide a row of analog injection pixels which have built-in sequences of "bright" and "dark" levels to provide a variable frequency output wave form.

* * * * *